US008736277B2

(12) United States Patent
Manzer et al.

(10) Patent No.: US 8,736,277 B2
(45) Date of Patent: May 27, 2014

(54) INTEGRATED TRANSFORMERS

(75) Inventors: Dennis G. Manzer, Bedford Hills, NY (US); Bucknell C. Webb, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 13/369,872

(22) Filed: Feb. 9, 2012

(65) Prior Publication Data

US 2013/0207765 A1 Aug. 15, 2013

(51) Int. Cl.
*G01R 31/06* (2006.01)

(52) U.S. Cl.
USPC .......................................................... 324/547

(58) Field of Classification Search
USPC ........................... 324/546, 547, 726; 375/258
See application file for complete search history.

(56) References Cited

U.S. PATENT DOCUMENTS 3,477,016 A 11/1969 Papaleonidas
4,665,357 A 5/1987 Herbert
5,093,646 A 3/1992 Herbert
7,315,463 B2 1/2008 Schrom et al.
7,504,808 B2 3/2009 Schrom et al.
7,656,263 B2 2/2010 Whittaker et al.
2005/0271147 A1* 12/2005 Dupuis ........................ 375/258

OTHER PUBLICATIONS

Holmes, D., et al. "Flat Transformers for Low Voltage, High Current, High Frequency Power Converters" HFPC Power Conversion, PowerSystems World '96. Sep. 1996. pp. 1-9.

* cited by examiner

*Primary Examiner* — Vincent Q Nguyen
(74) *Attorney, Agent, or Firm* — Tutunjian & Bitetto, P.C.; Louis Percello

(57) ABSTRACT

Systems, methods and devices directed to transformers are disclosed. One transformer system includes a set of transformer cells and a controller. The set of transformer cells is coupled in series to form a series coupling, where each transformer cell includes at least one first coil and at least one second coil. The second coil is configured to receive electrical energy from the first coil through magnetic interaction. The controller is configured to modify electrical aspects at ends of the series coupling by independently driving the transformer cells such that at least one of the transformer cells is driven differently from at least one other transformer cell in the set.

10 Claims, 6 Drawing Sheets

INTEGRATED TRANSFORMERS

BACKGROUND

1. Technical Field

The present invention relates to transformer systems, methods and devices and, more particularly, to transformers with integrated transformer elements.

2. Description of the Related Art

In general, a transformer transfers electrical energy from one circuit to another through magnetic interaction. For example, a varying current primary coil can induce a voltage in a second coil by generating a magnetic flux through the second coil through a magnetic core in the device. Transformers are widely used to convert the voltage of a circuit to another desired voltage. Small up and down voltage converters are utilized in a variety of different applications. For example, solar power battery and silicon device power delivery systems employ small-scale voltage converters. Integrated solutions offer the possibility of lower price, compactness and improved voltage regulation.

SUMMARY

One embodiment is directed to a transformer system including a set of transformer cells and a controller. The transformer cells of the set are coupled in series to form a series coupling, where each transformer cell includes at least one first coil and at least one second coil. The second coil is configured to receive electrical energy from the first coil through magnetic interaction. The controller is configured to modify electrical aspects at ends of the series coupling by independently driving the transformer cells such that at least one of the transformer cells is driven differently from at least one other transformer cell in the set.

An alternative embodiment is directed to a transformer device including a set of transformer cells and a controller. The transformer cells of the set are coupled in series to form a series coupling. Each transformer cell includes at least one first coil and at least one second coil. The second coil is configured to receive electrical energy from the first coil through magnetic interaction. The controller is configured to modify electrical aspects at ends of the series coupling by independently activating transformer cells in the set to receive the electrical energy such that at least one of the transformer cells in the set is activated and at least one other transformer cell in the set is deactivated.

Another embodiment is directed to a method for configuring a transformer. In accordance with the method, driving parameters for each transformer cell of a set of transformer cells is selected independently to modify electrical aspects at ends of the series coupling. The set of transformer cells is coupled in series to form a series coupling. In at least one transformer cell of the set, electrical energy is transferred from at least one first coil to at least one second coil through magnetic interaction. The transformer cells in the set of transformer cells are controlled in accordance with the selected driving parameters to adjust a duty cycle of at least one of the transformer cells in the set and to implement the modification of the electrical aspects.

An alternative embodiment is directed to a method for configuring a transformer. The transformer includes a set of transformer cells coupled in series to form a series coupling. In accordance with the method, at least one of the transformer cells is selected to be activated and at least one other transformer cell in the set is selected to be deactivated such that electrical energy is transferred from at least one first coil to at least one second coil in the activated transformer cells through magnetic interaction to form a converted voltage at ends of the series coupling. Switches in the transformer cells are controlled in accordance with the selections to generate the converted voltage. Here, the first coils of the transformer cells in the set of transformer cells are coupled in parallel by a drive line, where the switches couple the drive line to the respective first coils.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
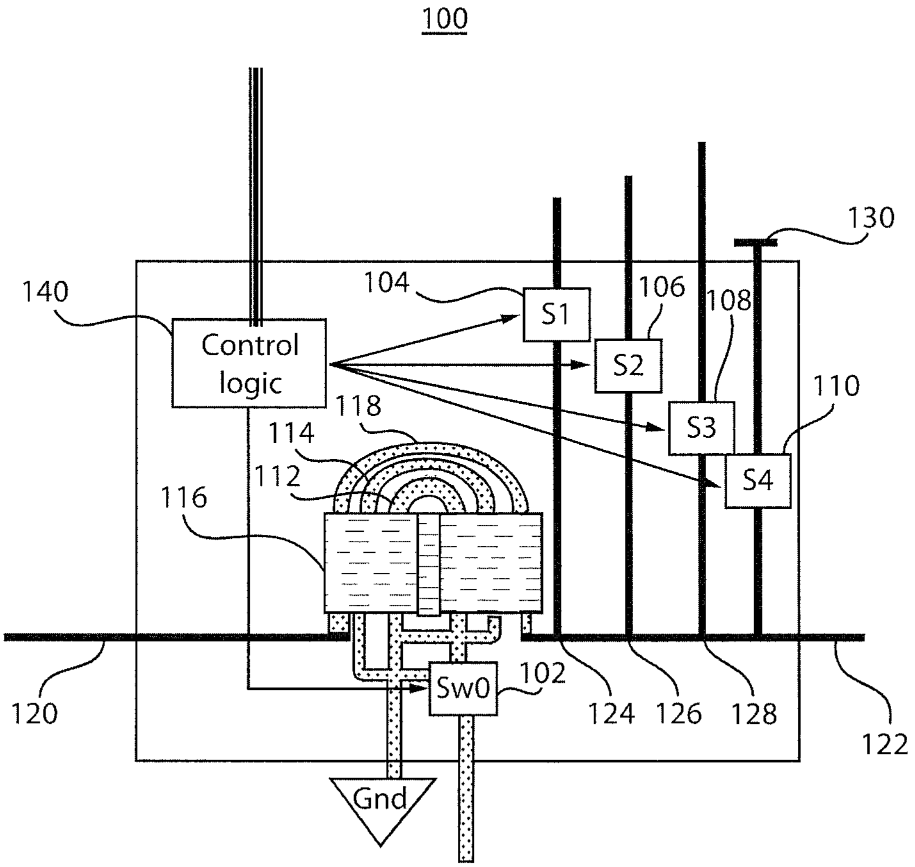
FIG. 1 is a high-level block diagram of a transformer cell in accordance with an exemplary embodiment.

As indicated above, transformer systems and voltage converters have a wide variety of applications. However, traditional converter configurations may not be viable or optimal for small-scale silicon driver structures, wiring configurations, integrated magnetic devices and the like. To provide viability and optimality, the present principles are directed to transformer systems that are composed of a series chain of transformer cells that can be independently driven or rectified. Here, the transformer cells can be individually activated or deactivated to implement voltage conversion and obtain a desired voltage. Further, the individually driven or rectified cells can be controlled to achieve a desired current or waveform. Alternatively or additionally, the duty cycles of the independently driven cells can be modified to implement a target voltage, impedance, current and/or waveform. In accordance with other exemplary aspects, output tap locations of each cell can be selected to achieve a desired voltage, impedance or waveform. In particular, multiphase waveforms can be generated and different regions of the chain of transformer cells can be configured to have different voltages by selecting tap locations accordingly. Other advantages of the independently driven transformer cells is that the same device can be easily adapted to a variety of different systems with different specifications of voltage, impedance, waveform and/or current by simply changing the routines of a central controller of the transformer system. For example, the controller can be modified to activate/deactivate transformer cells, configure the duty cycles of the transformer cells and/or select output tap locations of the cells differently depending on the particular specifications of the system in which the transformer will be implemented.

As will be appreciated by one skilled in the art, aspects of the present invention may be embodied as a system, method or computer program product. Accordingly, aspects of the present invention may take the form of an entirely hardware embodiment or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and/or computer program products according to embodiments of the invention. It will be understood that one or more blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, one or more blocks in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the present invention will be described in terms of a given illustrative architecture; however, other architectures, structures, substrate material and process features and steps may be varied within the scope of the present invention.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of a transformer system or device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a transformer cell 100 in accordance with an exemplary embodiment is illustratively depicted. Rather than using a single large multi-turn transformer for power conversion, for example, as a switching power regulator, conversion in accordance with this embodiment is performed by a series chain of smaller one-to-one or one-to-a-few transformer cells 100 driven and rectified by distributed local field-effect transistors (FET's), denoted in the cell 100 as switches Sw0 102, S1 104, S2 106, S3 108 and S4 110. Each local transformer 100 and its associated field-effect transistor (FET) network forms a repeated cell element of the chain, as illustrated in the system 200 of FIG. 2, where transformers c0 $\mathbf{100_0}$, c1 $\mathbf{100_1}$, c2 $\mathbf{100_2}$, c(N−1) $\mathbf{100_{N-1}}$ and cN $\mathbf{100_N}$, form the series chain or coupling 202. Here, the series chain 202 is composed of individual or nearly individually driven or rectified transformer cells 100. The chain 202 acts as a type of multitap or variable-turn (variac) transformer where the selection of which cells 100 are driven and/or where outputs Sw0-S4 are selected enables voltage selection, impedance matching, current selection and/or multiphase operation. In addition, the small size of the individual cells 100 permits for operation at high switching frequencies, thereby reducing the minimum size of the transformer elements. Adjustment of voltage, current, impedance matching and waveform shape can also be implemented by the system 200 by duty cycle variation of the various transformer cells 100. Here, high voltage silicon devices can be employed.

It should be noted that, in the following description, the transformer cell 100 and the transformer system 200 are implemented as voltage up converters. However, it should be understood that the transformer cell 100 and the transformer system 200 can be implemented as down converters by reversing inputs and outputs and by swapping drivers and rectifiers. For example, to use the cell 100 and transformer system 200 as a down converter, the input power should be connected to the series transformer side of the cell (for example, at 120) and the power is extracted at the parallel connected side (for example, between switch 102 and line 204) of the transformer cells. The voltage monitoring signals should be attached to the now lower voltage output side (for example, at 122). The switches are unchanged but now serve swapped functions, where "drivers" are on the input voltage side and "rectifiers" are on the output side.

Figure 2:
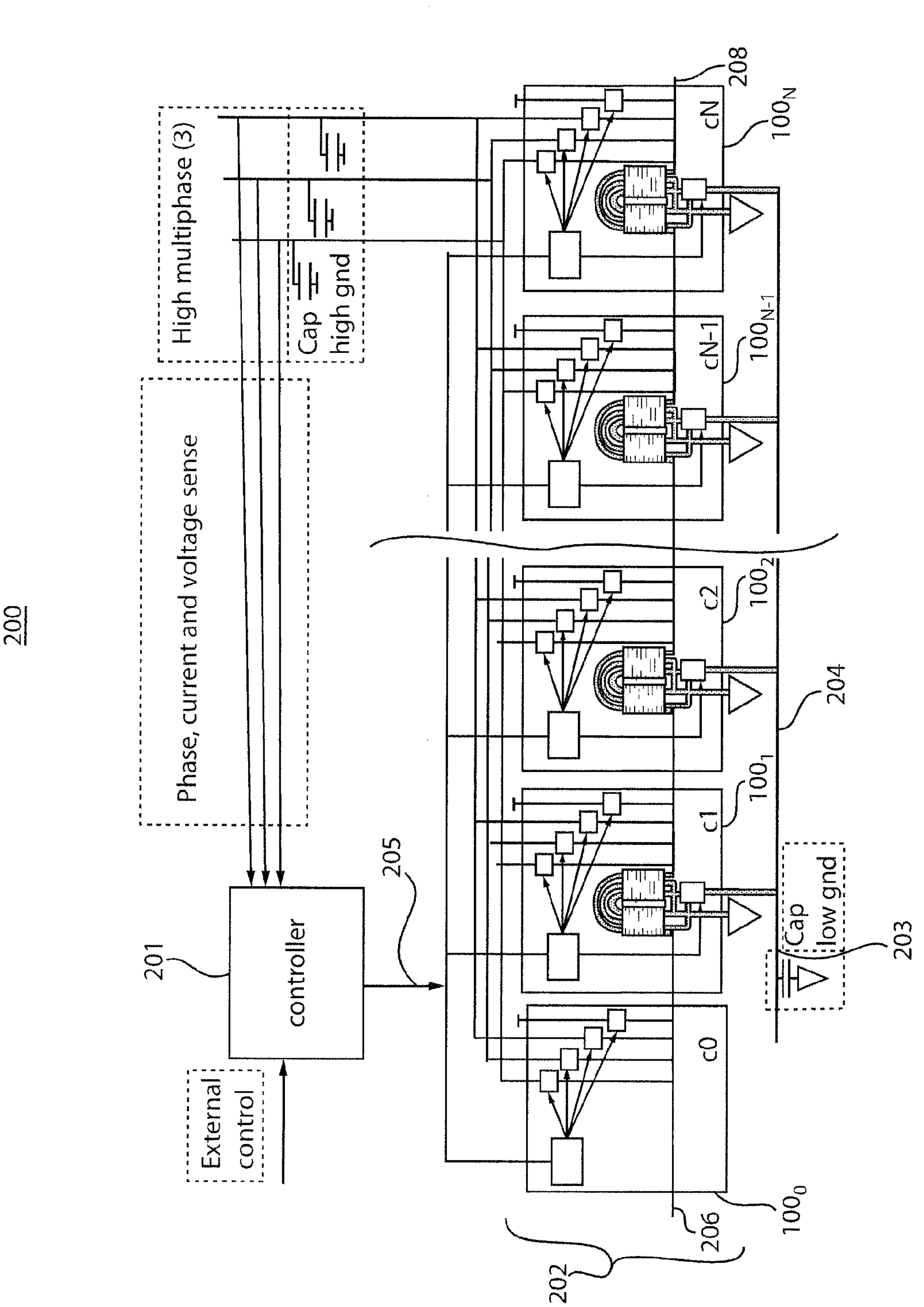
FIG. 2 is a high-level block diagram of a transformer system comprised of transformer cells in accordance with an exemplary embodiment.

The transformer cell 100 depicted in FIGS. 1 and 2 and the transformer system 200 illustrated in FIG. 2 are configured with three-phase outputs in each cell 100. Other numbers of phases can be implemented in the cells 100 and system 200, with the simplest case being the single phases direct current (DC) in and DC out.

Figure 7:
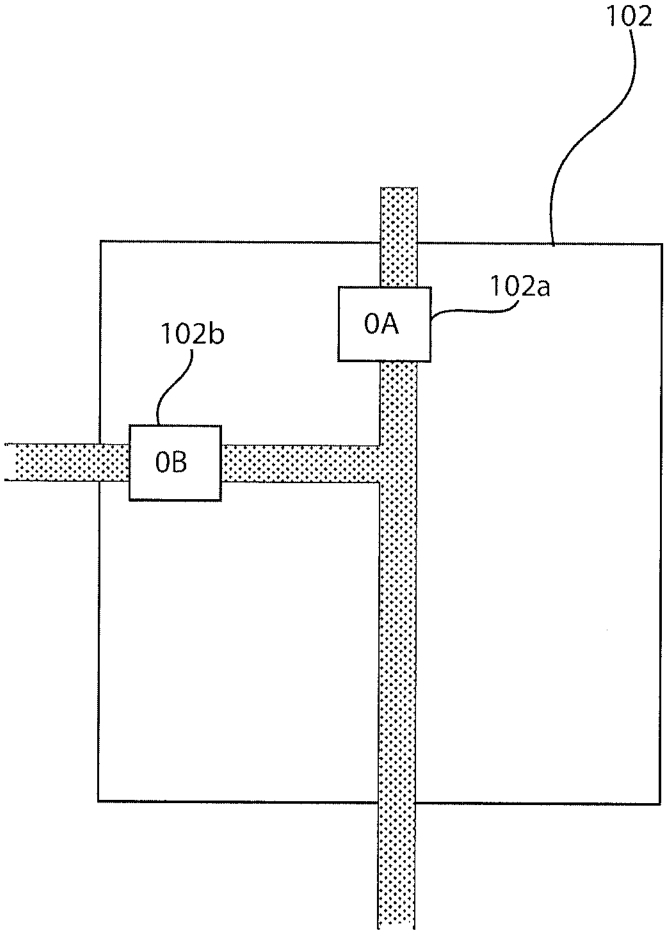
FIG. 7 is a high-level block diagram of a primary switch in accordance with an exemplary embodiment.

In the transformer cell 100, the primary, low DC voltage is switched by the FET pair sw0 102 at high frequency (1 MHz-100 MHz) to run a DC voltage onto the primary copper coils 112 and 114 as shown. With a fixed DC input, a square wave-alternating sign current is generated in the transformer. When the input voltage is positive, switch 102 is set to direct current in coil 112 with no current in coil 114. In turn, when the input voltage is negative, switch 102 is set to send current into coil 114 with no current in coil 112. As illustrated in FIG. 7, the switch 102 can be implemented with two switch components 102*a* and 102*b*, where the first component 102*a* is connected to coil 112 and the second component 102*b* is connected to coil 114. Here, the first switch component is on and the second switch component is open when the input voltage is positive. Conversely, the first switch component is open and the second switch component is on when the input voltage is negative. A single primary coil could, in the alternative, be used. However, in this case, another pair of FETs should be used to swap ground and the input DC voltage from end-to-end of the primary. This would create more FET switching loss.

The coils on switch 102*a* and switch 102*b* are wound in opposite directions, opening switch 102*a* and closing switch 102*b* has the effect of reversing the direction of current within the transformer. Switch 102*a* and switch 102*b* create the alternating current (AC) for the transformer and the output switches then take that transformer output AC and rectifies it to convert the output to DC or low frequency. Thus, to generate a positive current flow 102*a* is closed for the first half of the high frequency period.

The magnetic core 116 couples the primary coils 112, 114 magnetically with the secondary coil 118 creating a voltage between secondary input 120 and the secondary output 122. Possible tap locations phase 1 124, phase 2 126 and phase 3 128 and high ground 130 can be selected synchronously with the primary switching current by the controller 201 by utilizing FET switches S1 104, S2 106, S3 108 and S4 110. The FET switches are only activated if selected by the control logic 140 for a particular cell in accordance with signals the control logic 140 receives from the controller 201.

As illustrated in FIG. 2, cells $\mathbf{100_0}$-$\mathbf{100_N}$ are chained together to form the overall inverter system. In particular, the inputs for the primary component of the cells 100 are connected in parallel by a drive line 204 and are controlled via the switches Sw0 102. In turn, the secondary outputs 122 are coupled in series to enable step-up of voltage along the series coupling chain 202. Here, the secondary coils 118 are all chained together such that the voltage along the chain 202 is the sum of all the voltages generated by the secondaries in all the cells which have their primary coils driven: $V_{out}$=v*n*t$^2$, for n transformers, unloaded, where $V_{out}$ is the voltage between the ends or edges of the series coupling of n transformers, v is the voltage between a secondary input 120 and a secondary output 122 of a given cell 100 that is in the set of n transformers and t is the output/input coil turns ratio for the transformers. A preferred ratio is t=1.

Generally, the controller 201 drives the primary components of the transformer cells 100 synchronously along a segment of the chain 202 that is sufficient to generate the desired output voltage between connections points 206 and 208 at the ends of the series coupling 202. Equivalently, it should be noted that the connection points can correspond to the ends of any segment along the chain, which can also form a series coupling. The segment may be only activated cells or may include both activated and inactivated cells. A simple method to achieve this conversion is to implement the first connection 206 at cell c0 $\mathbf{100}_0$, which is before the first transformer and has no transformer itself, and to implement the second connection 208 at the end of cells $\mathbf{100}_1 \ldots \mathbf{100}_N$, where N is sufficient to generate the maximum output voltage difference. The high side connections can be activated by the controller 201 to rectify and drive the higher voltage phases. For example, for a DC-DC supply, cell $\mathbf{100}_0$ is connected to the output (high) ground and $\mathbf{100}_N$ is connected to the output for the first half of the radio frequency (rf) cycle, and, for the second half of the rf cycle, cell $\mathbf{100}_0$ is connected to the output for the inverted half of the rf cycle and $\mathbf{100}_N$ is connected to the output ground, thus rectifying the rf. A small capacitor on the input voltage can assist in supplying the varying current through the rf cycle.

In accordance with one example, the system 200 can be employed to convert the voltage of a solar cell. For example, a solar cell that delivers 100 W at 1.5V can be converted to 240 V, three-phase, by employing approximately 340 1:1 cells or 170 1:2 cells that are activated. The current in the primary of each 1:2 cell would be only about 400 mA. The individual cells for such a system could possibly be as small as 20000 $\mu m^2$ for a total chip area of about 4 $mm^2$.

It should be noted with regard to the system 200 that, when operating in an up conversion mode, because the switching frequency is much higher than the multiphase upper voltage, for example, about 50 Hz—about 440 Hz, which are common AC frequencies, the choice of taps permits for arbitrary, especially sinusoidal, output waveforms on the output phases of the cells 100. In the simplest implementation, for a 10:1 DC voltage up conversion, the secondaries of approximately ten 1:1 transformers are ganged in series, while the inputs are driven in parallel. The high switching frequency also permits the use of small filtering capacitors that can be integrated into the silicon. The chip may also include sensing and communications capability for phase and voltage synchronizing, safety features, start-up and programmability.

As indicated above, impedance matching can be implemented by the controller 201 by changing the number of active transformers 100. Here, impedance matching is inherent in voltage conversion.

In the embodiment 200, the controller or control logic 201 selects which of cells $\mathbf{100}_0$-$\mathbf{100}_N$ are driven. The control logic 201 also controls power-on, by gradually increasing the number of driven cells to avoid current inrush problems and provides external control signals, which may be used to turn the inverter system 200 on and off and control the supply voltages, currents, phases and phase timing in the system. The control logic 201 can also incorporate safety systems to ensure that voltage and current thresholds are not exceeded, as well as phase synchronization elements. For multi-supply power systems, such as solar cell arrays, where it may be important to avoid driving inactive power nets, external net power sensors can also be included in the control logic 201. The flexibility offered by the multiple cell configuration in the chain 202 would permit the same device to be configured for different types of DC-to-DC and multiphase systems. Higher power systems could be created by ganging these chips or chains 202 in parallel, with the control logic used to synchronize their outputs. Start-up bootstrapping could be implemented by a low voltage section of the control logic 201 that is capable of being powered by the input voltage. Once the system is initialized, power to the control logic could be supplied by adding an internal, DC phase to the cells or by simply utilizing some dedicated cells for internal voltage.

It should be noted that, for convenience, the driver (input voltage) switches and rectifier (output voltage) switches are referred to by driver switch periods. With transformers, the output voltage is delayed with respect to the input, typically by about ¼ period. A delay of the switching of the rectifier switches can be timed to minimize the voltage across the switch and power lost in the switch during the change of switch state. Further, the amount of time the driver switches are on can be adjusted to modify the output voltage. This can be generalized for the present embodiment by adjusting the on times for the driver switches either together or individually to adjust the output voltage(s).

Figure 3:
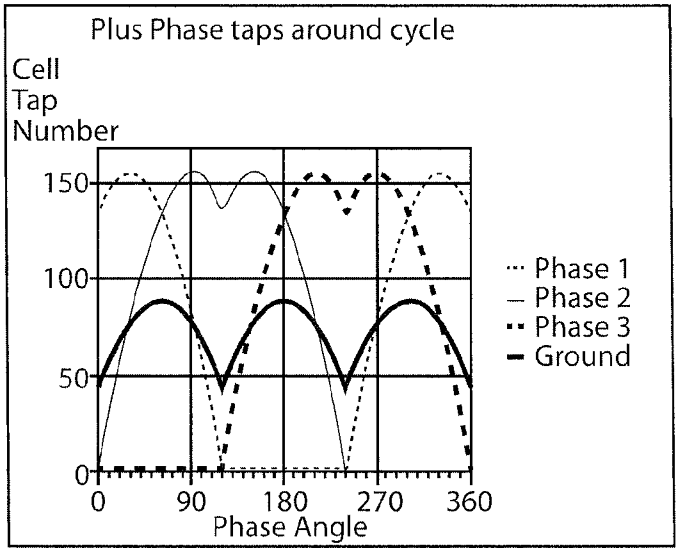
FIGS. 3 and 4 are graphs illustrating selections of transformer cells at different output taps at various stages of a cycle in accordance with an exemplary embodiment.
Figure 4:
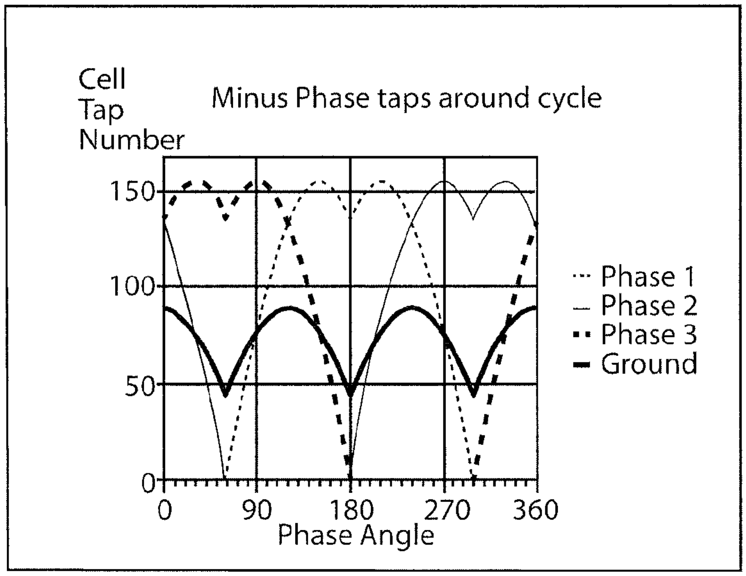

As indicated above, the selection of tap locations of active cells 100 permits the control of output waveforms, while, at the same time, achieving the desired target voltage. For example, for a multiphase output, the cells with active phase outputs change around the output phase cycle, which is much slower than the rf switching, to generate the appropriate output voltages. Again there is an inversion of order at each half rf cycle to perform the rectification. FIGS. 3 and 4 provide an example of cell selections that keeps the cell0 (c0) $\mathbf{100}_0$ as the beginning of the chain of driven cells throughout the cycle and that outputs a pre-determined waveform.

In FIGS. 3 and 4, tap selection for a 3-phase output is illustrated, where the vertical axis represents the number of cells for which a specific tap (Phase 1 124, Phase 2 126, Phase 3 128, High Ground 130) is selected (e.g., by setting switches 104, 106, 108 or 110 to an 'on' or coupling state) and the phase angle at which the selections are made. The figures illustrate only one of the possible of tap counting approaches. The phase with the extreme voltage tap is set to the cell 0, which is the most positive for the plus cycle half and the most negative for the minus cycle half. The tap number order is swapped between plus/minus each half cycle for rectification. The extreme tap changes over the cycle and the tap range scales with desired average voltage. It should be noted that the ground connection for the output phases is also switched. There are filter capacitors on the outputs that can enable this feature, but they can be fairly small, as the switching frequency is high.

To better illustrate how a desired waveform can be achieved in accordance with tap location selections, reference is made to Table 1, illustrating a particular set of tap location selections. In the tables and the description below, "0A" refers to the first switch component **102*a* of switch 102 described above and "0B" refers to the second switch component 102*b* of switch 102** described above.

TABLE 1

| Phase | S1 Phase 1 | S2 Phase 2 | S3 Phase 3 | S4 Ground |
|---|---|---|---|---|
| | Connections to outputs while 0A is on | | | |
| 0 | 135 | 0 | 0 | 45 |
| 10 | 146 | 27 | 0 | 58 |
| 20 | 154 | 53 | 0 | 69 |
| 30 | 156 | 78 | 0 | 78 |

TABLE 1-continued

| Phase | S1 Phase 1 | S2 Phase 2 | S3 Phase 3 | S4 Ground |
|---|---|---|---|---|
| 40 | 154 | 100 | 0 | 85 |
| 50 | 146 | 119 | 0 | 89 |
| 60 | 135 | 135 | 0 | 90 |
| 70 | 119 | 146 | 0 | 89 |
| 80 | 100 | 154 | 0 | 85 |
| 90 | 78 | 156 | 0 | 78 |
| 100 | 53 | 154 | 0 | 69 |
| 110 | 27 | 146 | 0 | 58 |
| 120 | 0 | 135 | 0 | 45 |
| 130 | 0 | 146 | 27 | 58 |
| 140 | 0 | 154 | 53 | 69 |
| 150 | 0 | 156 | 78 | 78 |
| 160 | 0 | 154 | 100 | 85 |
| 170 | 0 | 146 | 119 | 89 |
| 180 | 0 | 135 | 135 | 90 |
| 190 | 0 | 119 | 146 | 89 |
| 200 | 0 | 100 | 154 | 85 |
| 210 | 0 | 78 | 156 | 78 |
| 220 | 0 | 53 | 154 | 69 |
| 230 | 0 | 27 | 146 | 58 |
| 240 | 0 | 0 | 135 | 45 |
| 250 | 27 | 0 | 146 | 58 |
| 260 | 53 | 0 | 154 | 69 |
| 270 | 78 | 0 | 156 | 78 |
| 280 | 100 | 0 | 154 | 85 |
| 290 | 119 | 0 | 146 | 89 |
| 300 | 135 | 0 | 135 | 90 |
| 310 | 146 | 0 | 119 | 89 |
| 320 | 154 | 0 | 100 | 85 |
| 330 | 156 | 0 | 78 | 78 |
| 340 | 154 | 0 | 53 | 69 |
| 350 | 146 | 0 | 27 | 58 |
| 360 | 135 | 0 | 0 | 45 |
| | Connections to outputs while 0B is on | | | |
| 0 | 0 | 135 | 135 | 90 |
| 10 | 0 | 119 | 146 | 89 |
| 20 | 0 | 100 | 154 | 85 |
| 30 | 0 | 78 | 156 | 78 |
| 40 | 0 | 53 | 154 | 69 |
| 50 | 0 | 27 | 146 | 58 |
| 60 | 0 | 0 | 135 | 45 |
| 70 | 27 | 0 | 146 | 58 |
| 80 | 53 | 0 | 154 | 69 |
| 90 | 78 | 0 | 156 | 78 |
| 100 | 100 | 0 | 154 | 85 |
| 110 | 119 | 0 | 146 | 89 |
| 120 | 135 | 0 | 135 | 90 |
| 130 | 146 | 0 | 119 | 89 |
| 140 | 154 | 0 | 100 | 85 |
| 150 | 156 | 0 | 78 | 78 |
| 160 | 154 | 0 | 53 | 69 |
| 170 | 146 | 0 | 27 | 58 |
| 180 | 135 | 0 | 0 | 45 |
| 190 | 146 | 27 | 0 | 58 |
| 200 | 154 | 53 | 0 | 69 |
| 210 | 156 | 78 | 0 | 78 |
| 220 | 154 | 100 | 0 | 85 |
| 230 | 146 | 119 | 0 | 89 |
| 240 | 135 | 135 | 0 | 90 |
| 250 | 119 | 146 | 0 | 89 |
| 260 | 100 | 154 | 0 | 85 |
| 270 | 78 | 156 | 0 | 78 |
| 280 | 53 | 154 | 0 | 69 |
| 290 | 27 | 146 | 0 | 58 |
| 300 | 0 | 135 | 0 | 45 |
| 310 | 0 | 146 | 27 | 58 |
| 320 | 0 | 154 | 53 | 69 |
| 330 | 0 | 156 | 78 | 78 |
| 340 | 0 | 154 | 100 | 85 |
| 350 | 0 | 146 | 119 | 89 |
| 360 | 0 | 135 | 135 | 90 |

The selections generate three outputs phase 1, phase 2 and phase 3 with a 120 degree phase difference between them and a common ground. Table 1 shows the numbers of the cells with a connection to an output. The switch selections are also specified in Table 1. The circuit or system 200 operates by stepping through phase angle values at a constant rate to complete the entire 360 range in a time equal to the desired output period. The switch settings are different depending on the phase of the high frequency switching, that is, depending on whether switches 0A or 0B are on in the selected cells. The selected cells are those with numbers between 0 and the highest cell number in the table at that phase. For example, when the phase angle value is 40 and 0A is on, switch 1 104 of cell 100$_{154}$ is on to connect the cell output to the phase 1 124 output, switch 2 105 of cell 100$_{100}$ is on, connecting the transformer output to the phase 2 126 output, and switch 3 108 of cell 100$_{0}$ is on to connect the cell output to the phase 3 output 128 and switch 4 110 of cell 100$_{85}$ is on to connect the transformer output to the output ground 130. During the 0A-on half of the high frequency cycle, all of the 0A switches will be on for cells between 100$_{0}$ and 100$_{154}$. When the phase angle value is 40 and 0B is on, switch 1 104 of cell 100$_{0}$ is on to connect the cell output to the phase 1 output 124, switch 2 106 of cell 100$_{53}$ is on, connecting the transformer output to the phase 2 output 126, and switch 108 3 of cell 100$_{154}$ is on to connect the cell output to the phase 3 output 128 and switch 4 110 of cell 100$_{85}$ is on to connect the transformer output to the output ground 130. During the 0B-on half of the high frequency cycle, all of the 0B switches will be on for cells between 100$_{0}$ and 100$_{154}$. When the phase value is 360 the phase value is immediately reset to 0.

Table 1 illustrates a case where there are 36 phase steps. The number of phase steps can be changed depending on precision and output filtering requirements. For other output voltages and output loads, the table would be recomputed, as the cell numbers will scale linearly with the desired output voltage and inversely with the output load. Table 2, below, provides another example of selections of cells and output tap locations.

TABLE 2

| Phase | S1 Phase 1 | S2 Phase 2 | S3 Phase 3 | S4 Ground |
|---|---|---|---|---|
| | Connections to outputs while 0A is on | | | |
| 0 | 68 | 0 | 0 | 23 |
| 10 | 73 | 14 | 0 | 29 |
| 20 | 77 | 27 | 0 | 34 |
| 30 | 78 | 39 | 0 | 39 |
| 40 | 77 | 50 | 0 | 42 |
| 50 | 73 | 60 | 0 | 44 |
| 60 | 68 | 68 | 0 | 45 |
| 70 | 60 | 73 | 0 | 44 |
| 80 | 50 | 77 | 0 | 42 |
| 90 | 39 | 78 | 0 | 39 |
| 100 | 27 | 77 | 0 | 34 |
| 110 | 14 | 73 | 0 | 29 |
| 120 | 0 | 68 | 0 | 23 |
| 130 | 0 | 73 | 14 | 29 |
| 140 | 0 | 77 | 27 | 34 |
| 150 | 0 | 78 | 39 | 39 |
| 160 | 0 | 77 | 50 | 42 |
| 170 | 0 | 73 | 60 | 44 |
| 180 | 0 | 68 | 68 | 45 |
| 190 | 0 | 60 | 73 | 44 |
| 200 | 0 | 50 | 77 | 42 |
| 210 | 0 | 39 | 78 | 39 |
| 220 | 0 | 27 | 77 | 34 |
| 230 | 0 | 14 | 73 | 29 |
| 240 | 0 | 0 | 68 | 23 |
| 250 | 14 | 0 | 73 | 29 |
| 260 | 27 | 0 | 77 | 34 |
| 270 | 99 | 0 | 78 | 39 |
| 280 | 50 | 0 | 77 | 42 |

TABLE 2-continued

| Phase | S1 Phase 1 | S2 Phase 2 | S3 Phase 3 | S4 Ground |
|---|---|---|---|---|
| 290 | 60 | 0 | 73 | 44 |
| 300 | 68 | 0 | 68 | 45 |
| 310 | 73 | 0 | 60 | 44 |
| 320 | 77 | 0 | 50 | 42 |
| 330 | 78 | 0 | 39 | 39 |
| 340 | 77 | 0 | 27 | 34 |
| 350 | 73 | 0 | 14 | 29 |
| 360 | 68 | 0 | 0 | 23 |
| | Connections to outputs while 0B is on | | | |
| 0 | 0 | 68 | 68 | 45 |
| 10 | 0 | 60 | 73 | 44 |
| 20 | 0 | 50 | 77 | 42 |
| 30 | 0 | 39 | 78 | 39 |
| 40 | 0 | 27 | 77 | 34 |
| 50 | 0 | 14 | 73 | 29 |
| 60 | 0 | 0 | 68 | 23 |
| 70 | 14 | 0 | 73 | 29 |
| 80 | 27 | 0 | 77 | 34 |
| 90 | 39 | 0 | 78 | 39 |
| 100 | 50 | 0 | 77 | 42 |
| 110 | 60 | 0 | 73 | 44 |
| 120 | 68 | 0 | 68 | 45 |
| 130 | 73 | 0 | 60 | 44 |
| 140 | 77 | 0 | 50 | 42 |
| 150 | 78 | 0 | 39 | 39 |
| 160 | 77 | 0 | 27 | 34 |
| 170 | 73 | 0 | 14 | 29 |
| 180 | 68 | 0 | 0 | 23 |
| 190 | 73 | 14 | 0 | 29 |
| 200 | 77 | 27 | 0 | 34 |
| 210 | 78 | 39 | 0 | 39 |
| 220 | 77 | 50 | 0 | 42 |
| 230 | 73 | 60 | 0 | 44 |
| 240 | 68 | 68 | 0 | 45 |
| 250 | 60 | 73 | 0 | 44 |
| 260 | 50 | 77 | 0 | 42 |
| 270 | 39 | 78 | 0 | 39 |
| 280 | 27 | 77 | 0 | 34 |
| 290 | 14 | 73 | 0 | 29 |
| 300 | 0 | 68 | 0 | 23 |
| 310 | 0 | 73 | 14 | 29 |
| 320 | 0 | 77 | 27 | 34 |
| 330 | 0 | 78 | 39 | 39 |
| 340 | 0 | 77 | 50 | 42 |
| 350 | 0 | 73 | 60 | 44 |
| 360 | 0 | 68 | 68 | 45 |

Table 2 provides an example in which the output voltage is half that of the example of Table 1 or twice the output load of the example of Table 1. In general, table values for a multiphase with output phase voltage values $V_o \ldots V_N$ for the phase [0, N] at a give time, for phase i, can be computed as follows:

the 0A-on cell value$=S*(V_i-\min(V_0, \ldots, V_N))$, where S is the output/input voltage gain ratio and min is the minimum of the voltages. For the 0B-on section of the table table, the cell value for phase i is $S*(-V_i-\min(V_0, \ldots, V_N))$ The configuration of the system 200 permits a substantial degree of freedom to mix and match the voltage and ground tap points. If the chain or series coupling 202 has a sufficient length, the chain coupling 202 can be configured such that different regions of the chain 202 can supply different voltage levels, with only the restriction being that the chain voltage levels be continuous. The continuation constraint could be relaxed by adding FET switches into the chain with a trade-off of FET power dissipation. The phase of the rf drive on the different cells determines whether the voltage amplitude increases or decreases between successive cells. It should also be noted that chaining can increase the possible output current. Further, additional voltages can be obtained in addition to or instead of phase outputs by using more taps in the cells. However, care should be taken with regard to the power drawn at one tap, as it may affect other outputs. For example, small power draw taps can be implemented to ensure minimal effects on other outputs.

Figure 5A:
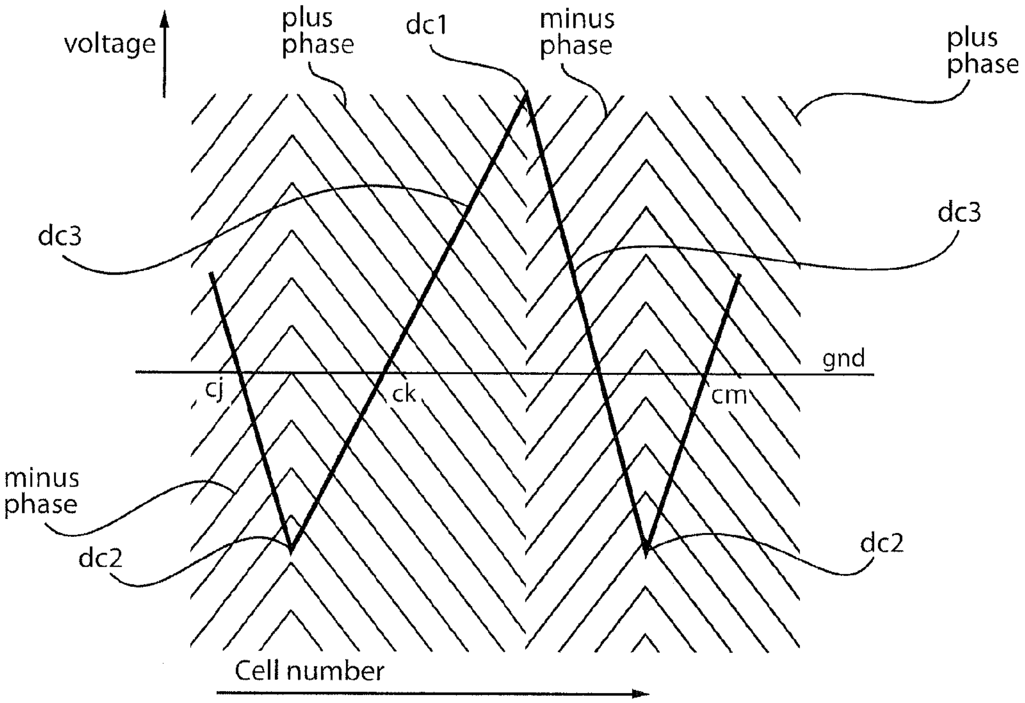
FIGS. 5A and 5B are diagrams illustrating implementations of different voltage levels at different regions of a transformer cell chain in accordance with exemplary embodiments.
Figure 5B:
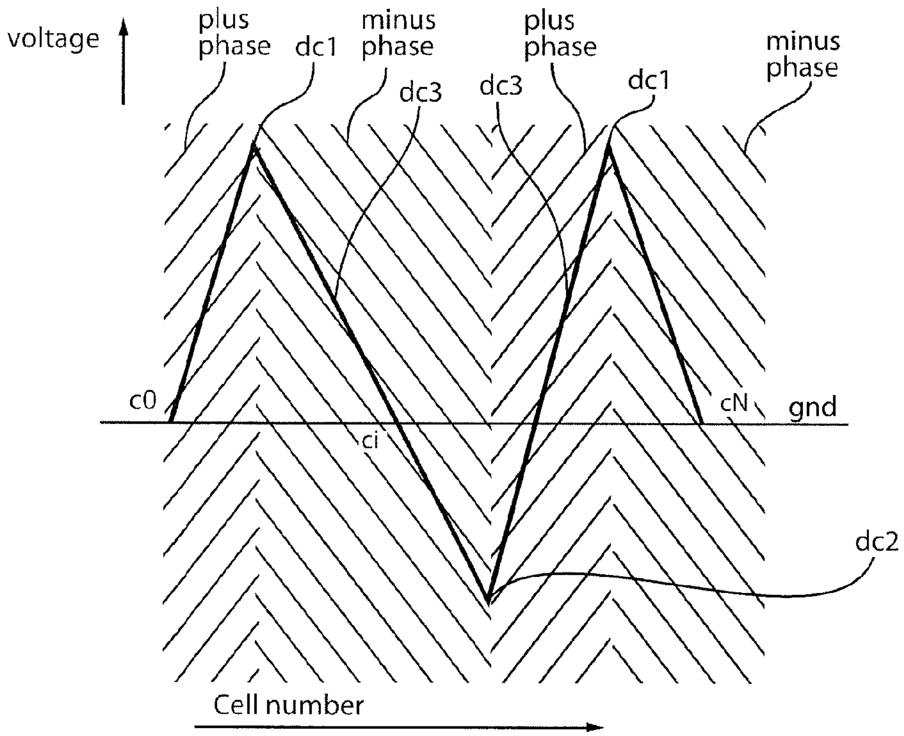

FIGS. 5A and 5B illustrate the implementation of different voltage levels at different regions of a transformer cell chain 202 in accordance with exemplary embodiments, where the horizontal-axis corresponds to a transformer cell number (i.e 1, . . . , N) and the vertical axis corresponds to the voltage provided between the transformer cell $\mathbf{100}_0$ and the selected output tap at the corresponding transformer cell $\mathbf{100}_n$. As illustrated in the diagrams, in addition to multiple phases, multiple DC levels can be extracted. If there is a sufficient number transformer cells 100 in the chain 202, the chain 202 can be folded or broken to create multiple points to achieve a given voltage by reversing the rf phase, as shown in FIGS. 5A and 5B.

In accordance with one example, for a DC output gain ratio of 10, a desired voltage ratio can be obtained using cells $\mathbf{100}_0$-$\mathbf{100}_{10}$, as shown on Table 3, below. The table has only one phase value, 0, since the output is DC.

TABLE 3

| S1 Phase 1 | 0A on | 0B on | S4 Ground |
|---|---|---|---|
| Connections to outputs during first half period | | | |
| 10 | 1 to 10 | | 0, 20 |
| Connections to outputs during second half period | | | |
| 0, 20 | | 1 to 10 | 10, 30 |

If there are more cells in the transformer chain, additional power capability can be obtained by using more transformer cells in a periodic fashion, as shown in Table 4, below. Here, multiple output-side switches are on at the same time. The voltage variation along the transformer cell chain is a sawtooth.

TABLE 4

| S1 Phase 1 | 0A on | 0B on | S4 Ground |
|---|---|---|---|
| Connections to outputs during first half period | | | |
| 10, 30 | 1 to 10, 31 to 40 | 11 to 20, 31 to 40 | 0, 20 |
| Connections to outputs during second half period | | | |
| 0, 20 | 11 to 20, 31 | 1 to 10, 31 to 40 | 10, 30 |

Embodiments can implement sawtooth chain segments that extend to maximum voltage if all outputs are the same sign, or from the positive to the negative voltages if opposite signs are needed. Tables 5 and 6 below illustrate tap selections in these scenarios.

TABLE 5

| Example Outputs of +V and +V* 0.3 | | | | |
|---|---|---|---|---|
| S1 +V | S2 +V* 0.3 | 0A on | 0B on | S4 Ground |
| Connections to outputs during first half period | | | | |
| 10 | | 1 to 10 | | 0 |
| Connections to outputs during second half period | | | | |
| 7 | 0 | | 1 to 10 | 10 |

TABLE 6

| Example Outputs of +V and −V* 0.3 | | | | |
|---|---|---|---|---|
| S1 +V | S2 −V* 0.3 | 0A on +V | 0B on | S4 Ground |
| Connections to outputs during first half period | | | | |
| 14 | 0 | 1 to 14 | | 4 |
| Connections to outputs during second half period | | | | |
| 0 | 14 | | 1 to 14 | 10 |

Figure 6:
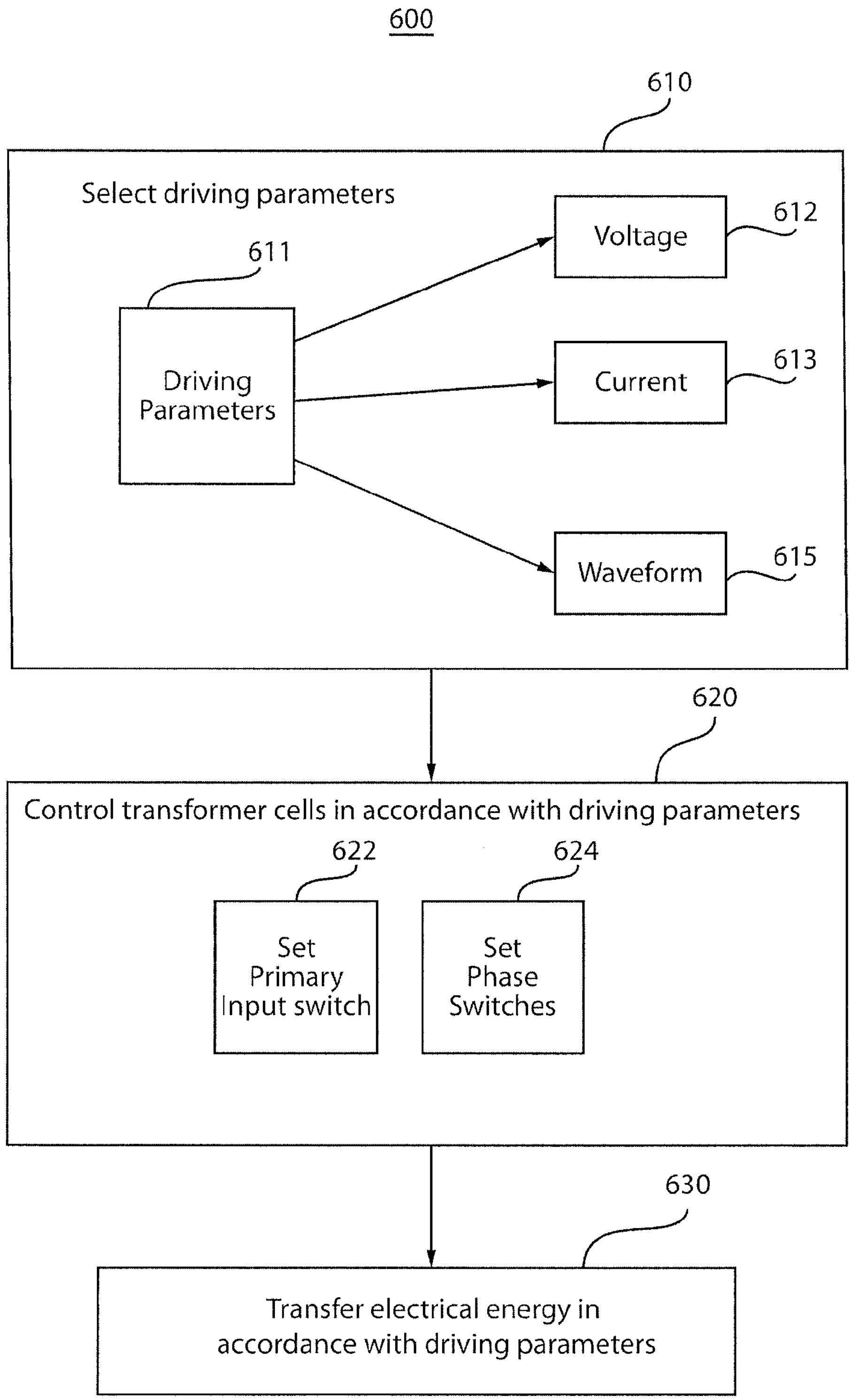
FIG. 6 is a high-level block/flow diagram of a method for configuring a transformer system in accordance with an exemplary embodiment.

Referring now to FIG. 6, an exemplary method 600 for controlling a transformer system is illustratively depicted. The method 600 can be performed to control the system 200 described above. In addition, it should be noted that each of the aspects described above can be implemented in the method 600. For example, the described features concerning voltage conversion, impedance matching, current control and waveform manipulation can be implemented in the method 600. The method 600 can begin at step 610, at which the controller 201 can select driving parameters for each of the cells 100 in the chain 202 to modify electrical aspects at ends of a series coupling formed in the chain 202. Further, at step 620, the controller 140 of one or more of the transformer cells 100 can control the transformer cells in accordance with the driving parameters selected at step 610. The controllers 140 can control their corresponding cells such that at least one of the transformer cells is driven differently from at least one other transformer cell in the set 202. In addition, at step 630, the core of one or more transformers 100 can implement a transforming operation in accordance with the driving parameters. For example, the core comprising primary coils 112, 114 and secondary coil 118 and the magnetic core 116 can implement a transmission of electrical energy from the primary coils to the secondary coil through magnetic interaction. Here, the steps 620 and 630 can be performed concurrently.

In accordance with exemplary aspects, at step 610, the controller 201 can select driving parameters 611 to modify electrical aspects, such as a desired voltage 612, current 613 and/or waveform 615, at ends of a series coupling formed by or within the set of transformer cells $\mathbf{100}_0$-$\mathbf{100}_N$. For example, the controller 201 can independently drive the cells $\mathbf{100}_0$-$\mathbf{100}_N$, as indicated above, by selecting drive parameters that denote which of the cells $\mathbf{100}_0$-$\mathbf{100}_N$ are to be activated and deactivated. For example, as illustrated in FIGS. 1 and 2, the primary coils 112 and 114 of cells $\mathbf{100}_0$-$\mathbf{100}_N$ are coupled in parallel by a drive line 204, which in turn is coupled to the primary coils 112 and 114 in each transformer cell 100 via a corresponding switch Sw0 102. The controller 140 of the corresponding transformer cell can obtain the respective driving parameters for its transformer cell from the controller 201 and can, at step 620, activate or deactivate its corresponding transformer cell 100 in accordance with the driving parameters by setting, at sub-step 622, its respective switch 102 to an "on" or conducting state in the activation case, where the activated cells transfer electrical energy at step 630, or in an "off" or non-conducting state in the deactivation case. In this way, the controller 201 can generate a desired converted voltage 612 at the ends of a series coupling formed by the set of transformers 202. As noted above, the system 200, and also the method 600, can implement a down-converted voltage or an up-converted voltage. Additionally or alternatively, the controller 201 can also use the drive parameters to obtain a desired waveform at an output of a given transformer cell $\mathbf{100}_n$ and/or of the series coupling. As described above, the control of the transformer cells in accordance with the selected driving parameters can generate the desired waveform. The controller 201 can monitor and sense the voltage and current at points 203 and 205 in the system 200 to select the driving parameters.

It should be noted that the series coupling can correspond to any region of the chain formed by the set 202, including the entirety of the chain or only a portion of the chain. For example, as noted above, different regions of the chain may have different output voltages. For example, the output voltage between the end 206 at transformer $\mathbf{100}_0$ and an output 122 of a given transformer cell $\mathbf{100}_n$ can vary with n, as described above with respect to FIGS. 5A and 5B. In addition, not all cells need be activated in a given series coupling to obtain the desired electrical aspects between the ends of the series coupling.

Alternatively or additionally, the electrical aspects can be controlled by selecting particular output tap locations 124, 126, 128 and 130 of each cell 100 to implement a desired voltage, impedance and/or multiphase waveform, as described above. At step 610, the controller 201 can select between the output tap locations 124, 126, 128 and 130 of each cell 100, or at least a subset of the cells, and can include the selections in the driving parameters sent to the control logic 140 of each corresponding cell. The control logic 140 can, in turn, at sub-step 624 of step 620, control the states of the switches 104, 106, 108 and 110 to implement the selected tap locations in accordance with the driving parameters 611, which could also include pre-determined switching frequencies to obtain the desired voltage, impedance and/or multiphase waveform.

As also indicated above, the selection of the active cells and the output tap locations can also be used to obtain a desired current at an output of a given cell.

Alternatively or additionally, the controller 201 can control the duty cycle of one or more of the transformer cells in the chain 202 to implement the desired voltage, impedance, current and/or waveform. For example, the different cells can be periodically activated and deactivated to obtain the desired voltage, impedance, current and/or waveform at a given series coupling of the chain. The controller 201 can indicate to the controllers 140 of the transformer cells $\mathbf{100}_0$-$\mathbf{100}_N$ when to activate and deactivate their respective cells by including such information in the driving parameters sent to the controllers 140. In addition, the duty cycle modifications can also incorporate the selection of output tap locations, as described above. Thus, the controller 201, at step 610, can select driving parameters to implement duty cycle modification of the transformer cells, and the controllers 140 can, at step 620, control the transformers in accordance with the driving parameters. As described above, the controller 201, through the controllers 140, can independently drive the transformer cells to implement pre-determined duty cycles.

Having described preferred embodiments of systems, methods and devices directed to integrated transformers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for configuring a transformer comprising:

selecting driving parameters for each transformer cell of a set of transformer cells, said transformer cells of the set coupled in series to form a series coupling, independently to modify electrical aspects at ends of the series coupling;

in at least one transformer cell of the set, transferring electrical energy from at least one first coil to at least one second coil through magnetic interaction; and controlling the transformer cells in the set of transformer cells in accordance with the selected driving parameters to adjust a duty cycle of at least one of the transformer cells in the set and to implement the modification of the electrical aspects.

2. The method of claim 1, wherein first coils of the set of transformer cells are coupled in parallel by a drive line and wherein the controlling comprises controlling switches in the at least one of the transformer cells to adjust the duty cycle.

3. The method of claim 1, wherein the electrical aspects include voltage.

4. The method of claim 1, wherein the voltage between the ends of the series coupling is a converted voltage.

5. The method of claim 1, wherein each of the transformer cells includes a plurality of output tap locations and wherein the controller is further configured to select between output tap locations of the plurality of tap locations for at least a subset of transformer cells in the set to modify the electrical aspects.

6. A method for configuring a transformer including a set of transformer cells coupled in series to form a series coupling comprising:

selecting at least one of the transformer cells to be activated and at least one other transformer cell in the set to be deactivated such that electrical energy is transferred from at least one first coil in the at least one of the transformer cells to at least one second coil in the at least one of the transformer cells through magnetic interaction to form a converted voltage at ends of the series coupling; and controlling switches in the at least one of the transformer cells and in the at least one other transformer cell in accordance with said selecting to generate the converted voltage, wherein the first coils of the transformer cells in the set of transformer cells are coupled in parallel by a drive line and wherein said switches couple the drive line to the respective first coils.

7. The method of claim 6, wherein said voltage is an up-converted voltage.

8. The method of claim 6, wherein said voltage is a down-converted voltage.

9. The method of claim 6, wherein each of the transformer cells includes a plurality of output tap locations and wherein the controller is further configured to select between output tap locations of the plurality of tap locations for at least a subset of transformer cells in the set to form the converted voltage.

10. The method of claim 9, wherein the selecting of output tap locations implements a pre-determined waveform with multiple phases.

* * * * *